United States Patent
Zhang et al.

(10) Patent No.: US 12,446,405 B2
(45) Date of Patent: Oct. 14, 2025

(54) DISPLAY PANEL AND METHOD FOR PREPARING SAME AND DISPLAY DEVICE

(71) Applicant: SHENZHEN CHINA STAR OPTOELECTRONICS SEMICONDUCTOR DISPLAY TECHNOLOGY CO., LTD., Guangdong (CN)

(72) Inventors: Letao Zhang, Guangdong (CN); Pengfei Liang, Guangdong (CN); Taijiun Hwang, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 733 days.

(21) Appl. No.: 17/599,521

(22) PCT Filed: Jul. 23, 2021

(86) PCT No.: PCT/CN2021/108262
§ 371 (c)(1),
(2) Date: Sep. 28, 2021

(87) PCT Pub. No.: WO2023/283998
PCT Pub. Date: Jan. 19, 2023

(65) Prior Publication Data
US 2023/0013050 A1    Jan. 19, 2023

(30) Foreign Application Priority Data
Jul. 15, 2021   (CN) .......................... 202110798294.7

(51) Int. Cl.
*H01L 27/32* (2006.01)
*H10K 59/122* (2023.01)
(Continued)

(52) U.S. Cl.
CPC ......... *H10K 59/122* (2023.02); *H10K 59/126* (2023.02); *H10K 59/1201* (2023.02); *H10K 71/00* (2023.02)

(58) Field of Classification Search
CPC ..... H10K 59/122; H10K 59/126; H10K 71/00
(Continued)

(56) References Cited

U.S. PATENT DOCUMENTS

2008/0315756 A1    12/2008 Jeon et al.
2013/0234121 A1*   9/2013 Sonoyama ............. H10K 50/11
                                                              438/34
(Continued)

FOREIGN PATENT DOCUMENTS

CN    105514144 A    4/2016
CN    107565063 A    1/2018
(Continued)

OTHER PUBLICATIONS

English Machine Translation of CN 109148516 (Year: 2019).*

*Primary Examiner* — Dzung Tran
(74) *Attorney, Agent, or Firm* — HSML P. C.

(57) ABSTRACT

Provided are a display panel and a method for preparing same and a display device. The preparation method includes: forming a step-shaped opening on a pixel define film using a patterning process; forming an organic photoresist in the opening; performing fluorinated plasma treatment on the pixel define film outside the opening such that the pixel define film outside the opening forms a first pixel define layer having a hydrophilic surface layer, and the remaining pixel define film forms a hydrophobic second pixel define layer; and removing the organic photoresist in the opening.

4 Claims, 4 Drawing Sheets

(51) Int. Cl.
*H10K 59/126* (2023.01)
*H10K 59/12* (2023.01)
*H10K 71/00* (2023.01)

(58) Field of Classification Search
USPC .......................................... 257/40
See application file for complete search history.

(56) References Cited

U.S. PATENT DOCUMENTS

| | | | |
|---|---|---|---|
| 2016/0268355 A1* | 9/2016 | Shi | H10K 71/20 |
| 2017/0358770 A1* | 12/2017 | Maeda | H10K 59/1315 |
| 2018/0034007 A1* | 2/2018 | He | H10K 50/822 |
| 2018/0190908 A1* | 7/2018 | Ke | H10K 30/00 |
| 2019/0058165 A1* | 2/2019 | Xu | G03F 7/094 |
| 2019/0165085 A1* | 5/2019 | Choi | H10K 50/824 |

FOREIGN PATENT DOCUMENTS

| | | |
|---|---|---|
| CN | 108493230 A | 9/2018 |
| CN | 108598110 A | 9/2018 |
| CN | 109148516 A | 1/2019 |
| CN | 109860239 A | 6/2019 |

\* cited by examiner

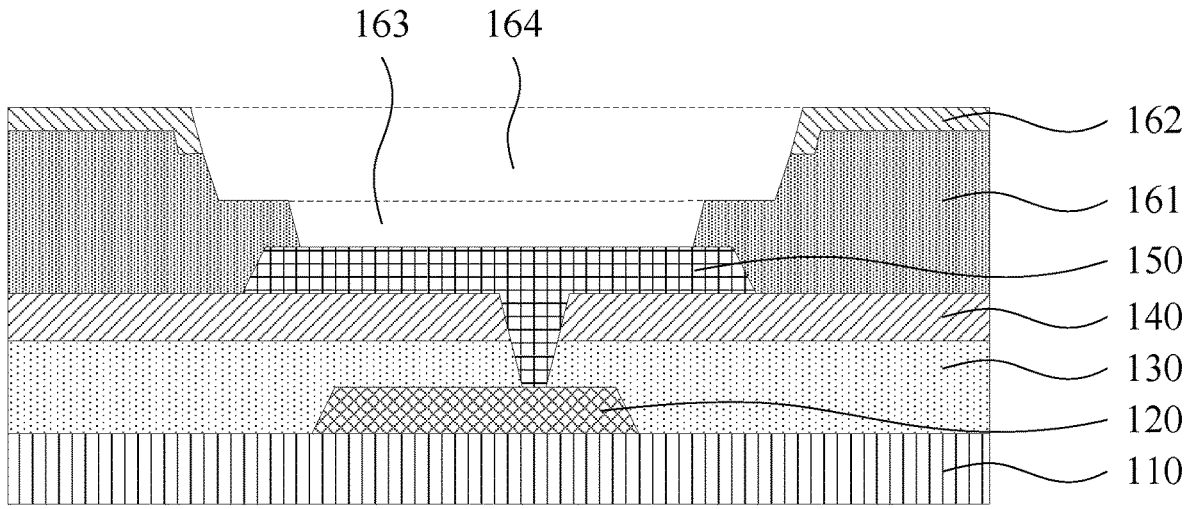

FIG. 3

| Prepare a pixel define film on a base plate, and pattern the pixel define film to form a step-shaped opening on the pixel define film, wherein the opening includes a first opening and a second opening, the second opening is located on a side of the first opening that is away from the base plate, and a step surface is formed at a joint between the second opening and the first opening | S1 |
|---|---|
| Form an organic photoresist in the opening, wherein the organic photoresist covers the step surface | S2 |
| Perform fluorinated plasma treatment on the pixel define film outside the opening such that the pixel define film outside the opening forms a first pixel define layer having a hydrophilic surface layer, and the remaining pixel define film forms a hydrophobic second pixel define layer | S3 |
| Remove the organic photoresist in the opening | S4 |

FIG. 4

DISPLAY PANEL AND METHOD FOR PREPARING SAME AND DISPLAY DEVICE

FIELD OF INVENTION

The present disclosure relates to the field of display, and in particular, to a display panel and a method for preparing same and a display device.

BACKGROUND OF INVENTION

An organic light-emitting diode (OLED) display panel currently has two pixel define layer structures, one is a pixel define layer composed of a single-layer hydrophobic material, and the other is a double-layer pixel define layer including a hydrophilic pixel define layer and a hydrophobic pixel define layer. FIG. 1 is a schematic diagram of a structure of a display panel according to the prior art. As shown in FIG. 1, the display panel includes a first pixel define layer 161' and a second pixel define layer 162' that are stacked. Compared with the single-layer pixel define layer, the double-layer pixel define layer not only improves the luminous efficiency of a device, but also increases uniformity of thicknesses of an organic light-emitting layer in a single pixel, thereby increasing the color gamut.

However, the conventional double-layer pixel define layer requires two photolithography processes during the manufacturing.

SUMMARY OF INVENTION

Technical Problem

Embodiments of the present disclosure provide a display panel and a preparation method therefor and a display device, so as to reduce a number of times for photoetching the conventional double-layer pixel define layer.

Technical Solution

According to one aspect, the present disclosure provides a method for preparing a display panel, the preparation method including steps of:
preparing a pixel define film on a base plate, and forming a step-shaped opening on the pixel define film using a patterning process, wherein the opening includes a first opening and a second opening, the second opening is located on a side of the first opening that is away from the base plate, and a step surface is formed at a joint between the second opening and the first opening;
forming an organic photoresist in the opening, wherein the organic photoresist covers the step surface;
performing fluorinated plasma treatment on the pixel define film outside the opening such that the pixel define film outside the opening forms a first pixel define layer having a hydrophilic surface layer, and the remaining pixel define film forms a hydrophobic second pixel define layer; and
removing the organic photoresist in the opening.

Optionally, in some embodiments of the present disclosure, the step of preparing the pixel define film on the base plate, and forming the step-shaped opening on the pixel define film using the patterning process includes:
coating a layer of pixel define layer material on the base plate, and curing the pixel define layer material to form the pixel define film; and
performing a patterning process on the pixel define film using an exposure and development process to form the opening.

Optionally, in some embodiments of the present disclosure, the step of performing the patterning process on the pixel define film using the exposure and development process to form the opening includes:
removing an entirety of the pixel define layer material in an area corresponding to the first opening using a half-tone mask and the exposure and development technology, and removing a part of the pixel define layer material in an area outside the first opening and within the second opening.

Optionally, in some embodiments of the present disclosure, the step of forming the organic photoresist in the opening includes:
forming a layer of organic photoresist on the pixel define film; and
removing the organic photoresist outside the opening by means of patterning.

Optionally, in some embodiments of the present disclosure, the step of forming the organic photoresist in the opening includes:
forming a layer of organic photoresist on the pixel define film; and
removing the organic photoresist outside the opening and a part of the organic photoresist in the second opening by means of patterning.

According to another aspect, the present disclosure further provides a display panel, including:
a base plate; and
a pixel define film, disposed on the base plate and on which a step-shaped opening is formed, wherein the opening includes a first opening and a second opening, the second opening is located on a side of the first opening that is away from the base plate, and a step surface is formed at a joint between the second opening and the first opening;
the pixel define film includes:
a first pixel define layer, disposed on the base plate; and
a second pixel define layer, disposed on a side of the first pixel define layer that is away from the base plate and located outside the opening.

Optionally, in some embodiments of the present disclosure, the first pixel define layer is hydrophilic, and the second pixel define layer is hydrophobic.

Optionally, in some embodiments of the present disclosure, the second pixel define layer has a same thickness at all positions.

Optionally, in some embodiments of the present disclosure, the second pixel define layer has a larger thickness at an outer periphery of the second opening than outside the outer periphery of the second opening.

According to yet another aspect, an embodiment of the present disclosure further provides a display device, including the display panel provided in any embodiment of the present disclosure.

Beneficial Effects

Embodiments of the present disclosure provide a display panel and a preparation method therefor and a display device. The preparation method includes steps of: preparing a pixel define film on a base plate, and forming a step-shaped opening on the pixel define film using a patterning process, wherein the opening includes a first opening and a second opening, the second opening is located on a side of the first opening that is away from the base plate, and a step surface is formed at a joint between the second opening and the first opening; forming an organic photoresist in the opening, wherein the organic photoresist covers the step surface; performing fluorinated plasma treatment on the pixel define film outside the opening such that the pixel define film outside the opening forms a first pixel define layer having a hydrophilic surface layer, and the remaining pixel define film forms a hydrophobic second pixel define layer; removing the organic photoresist in the opening. According to the embodiments of the present disclosure, a first pixel define layer having a hydrophilic surface and a second pixel define layer having a hydrophobic surface are formed using a photolithography process and a fluorinated plasma treatment process, which simplifies the preparation process and reduces a number of times for photolithography.

BRIEF DESCRIPTION OF DRAWINGS

To describe the technical solutions in the embodiments of the present disclosure more clearly, the accompanying drawings required for describing the embodiments are briefly described hereinafter. Apparently, the accompanying drawings in the following descriptions show merely some embodiments of the present disclosure, and a person skilled in the art can obtain other accompanying drawings according to these accompanying drawings without creative efforts.

FIG. 3 is a schematic diagram of a second structure of the display panel according to an embodiment of the present disclosure.

FIG. 4 is a flowchart of a method for preparing a display panel according to an embodiment of the present disclosure.

DETAILED DESCRIPTION OF PREFERRED EMBODIMENTS

The technical solutions of the embodiments of the present disclosure are clearly and completely described in the following with reference to the accompanying drawings of the embodiments of the present disclosure. Apparently, the described embodiments are merely some but not all of the embodiments of the present disclosure. All other embodiments obtained by a person skilled in the art based on the embodiments of the present disclosure without creative efforts shall fall within the protection scope of the present disclosure. In addition, it should be understood that the specific implementations described herein are merely used for describing and illustrating the present disclosure, but are not intended to limit the present disclosure. In the present disclosure, unless otherwise stated, the directional terms such as "up" and "down" generally refer to directions when a device is in actual use or a working state, and specifically refer to drawing directions in the corresponding drawing; and "inside" and "outside" refer to positions relative to the contour of the device.

Embodiments of the present disclosure provide a display panel and a preparation method therefor and a display device, so as to reduce a number of times for photoetching the conventional double-layer pixel define layer. Detailed descriptions are separately provided below. It should be noted that, the description order of the following embodiments is not intended to limit preference orders of the embodiments.

Figure 5:
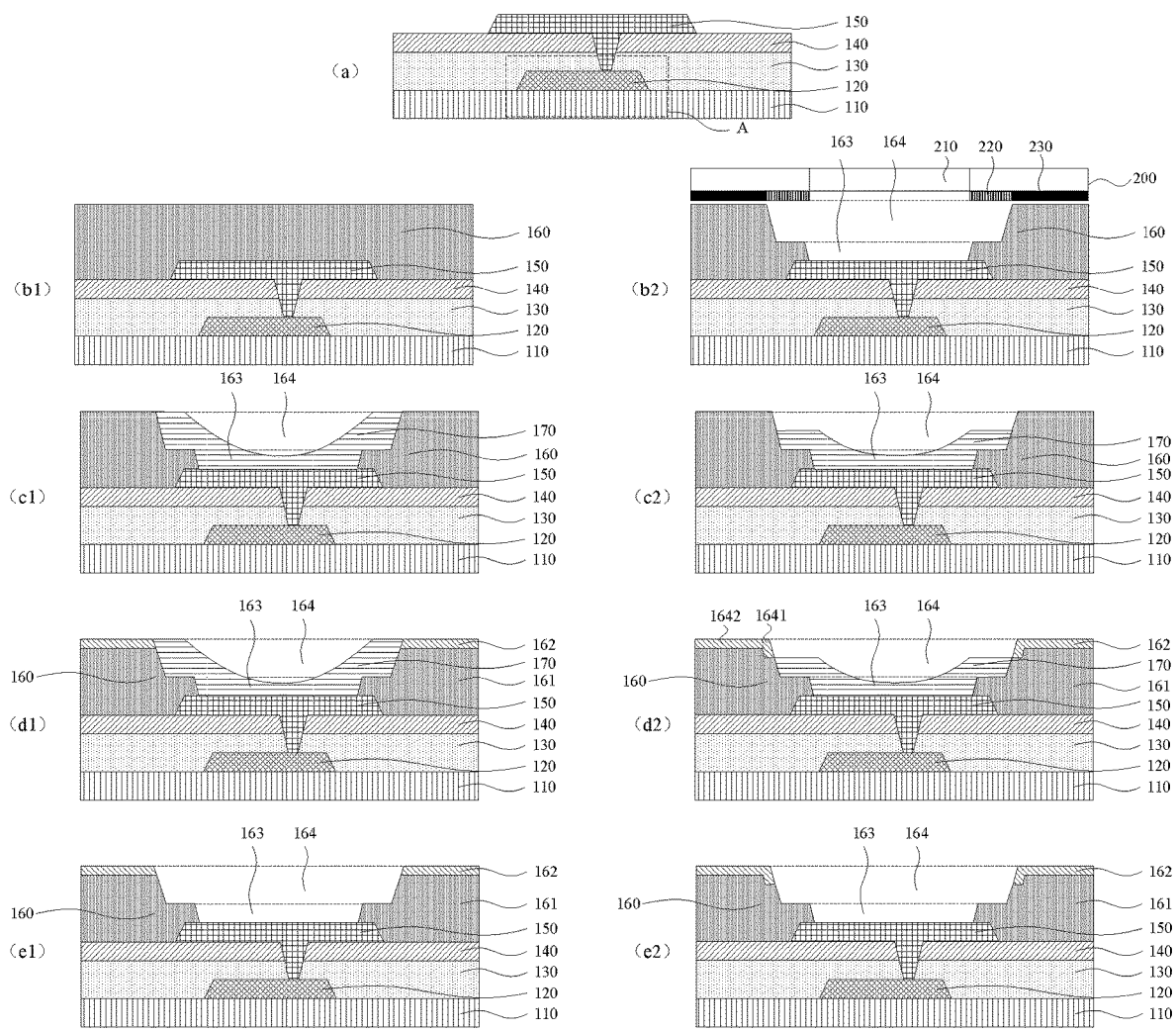
FIG. 5 is a schematic diagram of the method for preparing a display panel according to an embodiment of the present disclosure.

In an embodiment, the present disclosure provides a method for preparing a display panel. The preparation method is used for preparing the display panel provided in any embodiment of the present disclosure. Referring to FIGS. 2 to 5, FIG. 2 and FIG. 3 are respectively schematic diagrams of two different structures of the display panel according to an embodiment of the present disclosure. FIG. 4 is a flowchart of a method for preparing a display panel according to an embodiment of the present disclosure. FIG. 5 is a schematic diagram of the method for preparing a display panel according to an embodiment of the present disclosure. The preparation method includes steps as follows.

Step S1: Prepare a pixel define film on a base plate, and pattern the pixel define film to form a step-shaped opening on the pixel define film. The opening includes a first opening and a second opening, the second opening is located on a side of the first opening that is away from the base plate, and a step surface is formed at a joint between the second opening and the first opening. In detail, step S1 includes steps as follows.

First step: Prepare a base plate.

Figure 6:
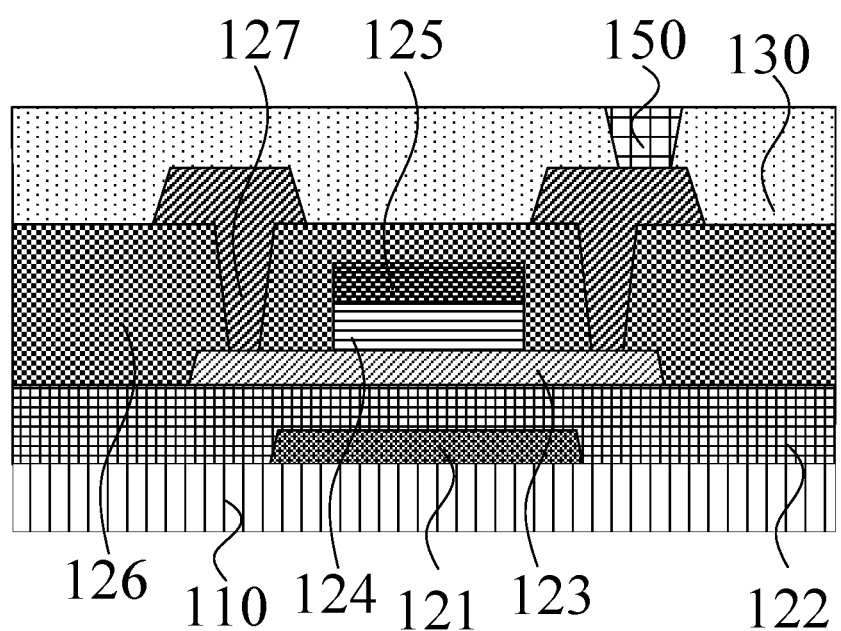
FIG. 6 is a schematic diagram of a film layer structure at a dotted frame A in FIG. 5.

In detail, referring to FIG. 5(a), the preparing a base plate includes steps below. First, a substrate 110 is provided. The substrate 110 can be a rigid substrate, such as glass, or an organic flexible substrate, such as polyimide (PI). Second, a thin film transistor layer 120 is prepared on the substrate 110. FIG. 6 is a schematic diagram of a film layer structure at a dotted frame A in FIG. 5. As shown in FIG. 5(a) and FIG. 6, the thin film transistor layer 120 usually includes a light-shielding layer 121, a buffer layer 122, a semiconductor active layer 123, a gate insulating layer 124, a gate layer 125, an interlayer insulating layer 126, and a source/drain layer 127 that are stacked from bottom to top. The semiconductor active layer 123, the gate layer 125, and the source/drain layer 127 jointly form components and parts of the display panel, such as a thin film transistor, a capacitor, and the like. The semiconductor active layer 123 is patterned to form an active area of the thin film transistor. The active area includes a channel area and doped areas located on two sides of the channel area. The doped area is formed by conducting the semiconductor active layer in a corresponding area after the gate insulating layer and the gate layer are formed, for example. The gate layer 125 is patterned to form a gate of the thin film transistor and an electrode plate of the capacitor, and the gate simultaneously corresponds to the channel area of the active layer. The source/drain layer 127 is patterned to form a source and a drain of the thin film transistor, and the source and the drain are respectively connected to the doped areas on two sides of the channel area using via holes extending through the interlayer insulating layer 126. Third, a passivation layer 130 is deposited on the thin film transistor layer 120 using a plasma enhanced chemical vapor deposition (PECVD) method or by sputtering. The passivation layer 130 is an inorganic material layer, including but not limited to silicon oxide ($SiO_2$), silicon nitride ($SiN_x$), and aluminum oxide ($Al_2O_3$). Then, a photolithography process is used to pattern the passivation layer 130 at a position corresponding to the source or the drain of the thin film transistor to obtain a passivation layer via hole that extends through the passivation layer 130, and the source or the drain of the thin film transistor is exposed from the passivation layer via hole. Similarly, a flat layer 140 is deposited on the passivation layer 130 using a physical vapor deposition (PVD) method. A material of the flat layer 140 is an organic material, and then the flat layer 140 is patterned using a yellow light process, to remove the material of the flat layer that is in and on the passivation layer via hole, thereby obtaining a flat layer via hole extending through the flat layer 140. Next, an anode layer 150 is deposited on the flat layer 140. A material of the anode layer 150 is any one of ITO/Ag/ITO, Ag/ITO, Al/WOx, Ag/IZO, and the like. The anode layer 150 is patterned using a photolithography process to remove the anode layer outside an anode pattern, and only anodes in a spaced arrangement remain. Each anode is connected to the source or the drain of the thin film transistor through a via hole extending through the planarization layer 140 and the passivation layer 130.

Second step: referring to (b1) and (b2) in FIG. 5, a layer of pixel define layer material is coated on the base plate to form a pixel define film 160. The pixel define film 160 is patterned using an exposure and development process to form a first opening 163 and a second opening 164.

In detail, a layer of pixel define layer material is coated on the base plate. The pixel define layer material is, for example, hydrophobic. The pixel define layer material is cured to form a pixel define film 160. The pixel define film 160 covers the flat layer 140 and the anode layer 150. The pixel define film 160 at the corresponding position of the anode layer 150 is removed using a half-tone mask 200 by means of an exposure and development technology to form the first opening 163 and the second opening 164. The pixel define layer material is a positive organic photoresist material and is hydrophilic. The half-tone mask 200 includes a fully transparent area 210, a half-tone area 220, and a light-shielding area 230. During the exposure, the fully transparent area 210 corresponds to the pixel define film 160 in an area of the first opening 163. The half-tone area 220 corresponds to the pixel define film 160 in an area outside the first opening 163 within the second opening 164, and the light-shielding area 230 corresponds to the pixel define film 160 in an area outside the second opening 164. In this way, the pixel define film 160 in the area where the first opening 163 is located is fully exposed, the pixel define film 160 in the area outside the first opening 163 within the second opening 164 is partially exposed, and the pixel define film 160 in the area outside the second opening 164 is not exposed. The exposed pixel define film 160 is developed using a developer to remove an entirety of the pixel define film 160 in the area where the first opening 163 is located. A part of the pixel define film 160 in the area outside the first opening 163 within the second opening 164 is removed, and the pixel define film 160 outside the second opening 164 is retained to form the pixel define film 160 having a first opening 163 and a second opening 164. The first opening 163 and the second opening 164 form a step surface at a joint.

Step S2: Form an organic photoresist in the opening, wherein the organic photoresist covers the step surface. In detail, step S2 includes steps as follows.

In a first embodiment, referring to FIG. 5 (c1), a layer of organic photoresist is formed on the pixel define film 160, the organic photoresist outside the first opening 163 and the second opening 164 is removed by means of patterning, and an organic photoresist layer 170 within the first opening 163 and the second opening 164 is retained.

In a second embodiment, referring to FIG. 5 (c2), a layer of organic photoresist is formed on the pixel define film 160, the organic photoresist outside the first opening 163 and the second opening 164 and a part of the organic photoresist in the second opening 164 are removed by means of patterning, and an organic photoresist layer 170 in the first opening 163 and a part of the organic photoresist layer 170 in the second opening 164 are retained.

In step S2, the organic photoresist layer can be removed using oxygen by means of patterning, such as ashing.

Step S3: Perform fluorinated plasma treatment on the pixel define film outside the opening such that the pixel define film outside the opening forms a first pixel define layer having a hydrophilic surface layer, and the remaining pixel define film forms a hydrophobic second pixel define layer. In detail, step S3 includes steps as follows.

Referring to (d1) and (d2) in FIG. 5, the pixel define film 160 that is not covered and protected by the organic photoresist layer 170 and outside the first opening 163 and the second opening 164 is treated using a fluorinated plasma gas, and the pixel define film 160 after being treated by the fluorinated plasma gas is hydrophobic. The hydrophilic pixel define film 160 that has not been treated by the fluorinated plasma gas forms the first pixel define layer 161, and the hydrophobic pixel define film 160 that has been treated by the fluorinated plasma gas forms the second pixel define layer 162.

In the first embodiment, the fluorinated plasma gas processes the pixel define film 160 from the upper surface. Therefore, a certain thickness of the pixel define film 160 after being treated by the fluorinated plasma gas maintains uniformity. The pixel define film has a same thickness at all positions, as shown in (d1) in FIG. 5 and FIG. 2.

In the second embodiment, a top surface of the organic photoresist layer 170 is lower than the top surface of the pixel define film 160. The fluorinated plasma gas treats the pixel define film 160 from the upper surface of the pixel define film 160 and the side of the second opening 164. Therefore, the pixel define film 160 has a larger thickness at an outer periphery 1641 of the second opening 164 than outside the outer periphery 1642 of the second opening 164 after being treated by the fluorinated plasma gas, as shown in (d2) in FIG. 5 and FIG. 3.

Step S4: Remove the organic photoresist in the opening. In detail, step S4 includes steps as follows.

Referring to (e1) and (e2) in FIG. 5, the remaining organic photoresist is stripped to remove the remaining organic photoresist in the first opening 163 and the second opening 164.

In the method for preparing a display panel provided in the embodiment of the present disclosure, the preparation method is to adopt a set of half-tone masks, a first pixel define layer having a hydrophilic surface and a second pixel define layer having a hydrophobic surface are formed using a photolithography process and a fluorinated plasma treatment process, which simplifies the preparation process and reduces a number of times for photolithography.

Figure 1:
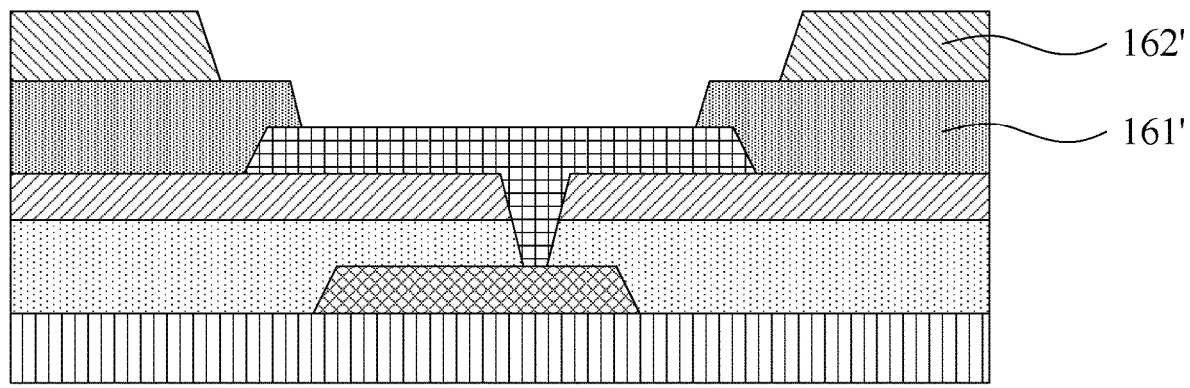
FIG. 1 is a schematic diagram of a structure of a display panel according to the prior art.
Figure 2:
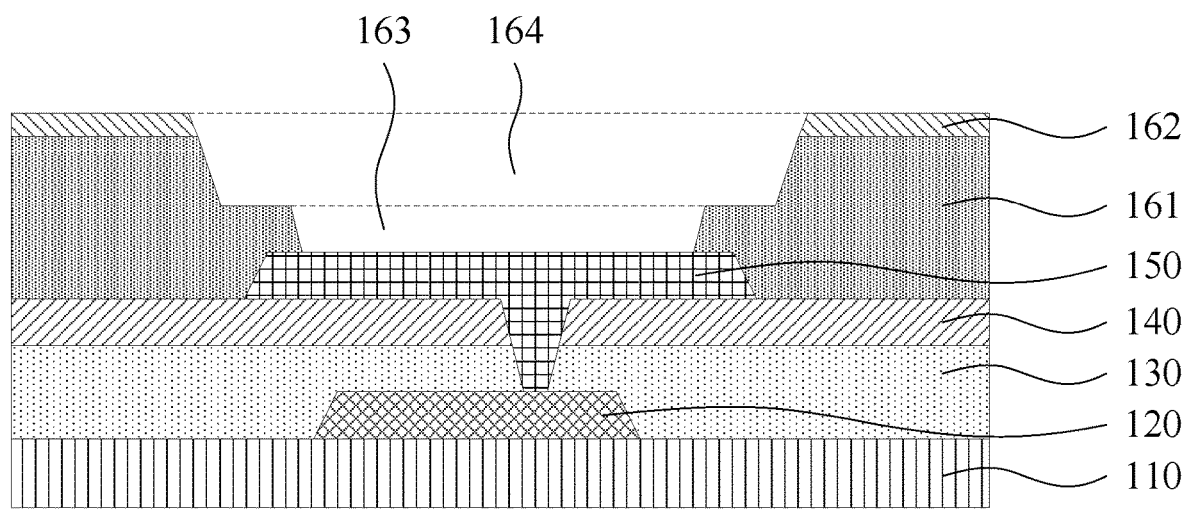
FIG. 2 is a schematic diagram of a first structure of a display panel according to an embodiment of the present disclosure.

In an embodiment, the present disclosure further provides a display panel. The display panel is prepared using the method for preparing a display panel provided in any embodiment of the present disclosure. Referring to FIG. 2 and FIG. 3, FIG. 2 is a schematic diagram of a first structure of a display panel according to an embodiment of the present disclosure, and FIG. 3 is a schematic diagram of a second structure of the display panel according to an embodiment of the present disclosure. As shown in FIG. 2, the display panel provided in the embodiment of the present disclosure includes:

a base plate; and a pixel define film 160, disposed on the base plate and on which a step-shaped opening is formed, wherein the opening includes a first opening 163 and a second opening 164, the second opening 164 is located on a side of the first opening 163 that is away from the base plate, and a step surface is formed at a joint between the second opening 164 and the first opening 163;

the pixel define film 160 includes:

a first pixel define layer 161, disposed on the base plate; and a second pixel define layer 162, disposed on a side of the first pixel define layer 161 that is away from the base plate and located outside the opening.

In detail, referring to FIG. 2 and FIG. 3, in the display panel provided in the embodiment of the present application, the base plate is an array base plate, and includes a substrate 110, a thin film transistor layer 120, a passivation layer 130, a planarization layer 140, and an anode layer 150 that are stacked in sequence.

In an embodiment, the first pixel define layer 161 is hydrophobic, and the second pixel define layer 162 is hydrophobic.

In an embodiment, the second pixel define layer 162 has a same thickness at all positions.

In an embodiment, the second pixel define layer 162 has a larger thickness at an outer periphery 1641 of the second opening 164 than outside the outer periphery 1642 of the second opening 164.

Correspondingly, an embodiment of the present disclosure further provides a display device. The display device includes the display panel provided in any one of the embodiments of the present disclosure, and has the technical features and technical effects of any one of the display panels provided in the embodiments of the present disclosure. For implementation and operating principles, refer to the above detailed embodiments, and details are not described herein again.

Based on the above, the embodiments of the present disclosure provide a display panel and a preparation method therefor and a display device. The preparation method includes steps of: preparing a pixel define film on a base plate, and forming a step-shaped opening on the pixel define film using a patterning process, wherein the opening includes a first opening and a second opening, the second opening is located on a side of the first opening that is away from the base plate, and a step surface is formed at a joint between the second opening and the first opening; forming an organic photoresist in the opening, wherein the organic photoresist covers the step surface; performing fluorinated plasma treatment on the pixel define film outside the opening such that the pixel define film outside the opening forms a first pixel define layer having a hydrophilic surface layer, and the remaining pixel define film forms a hydrophobic second pixel define layer; and removing the organic photoresist in the opening. According to the embodiments of the present disclosure, a first pixel define layer having a hydrophilic surface and a second pixel define layer having a hydrophobic surface are formed using a photolithography process and a fluorinated plasma treatment process, which simplifies the preparation process and reduces a number of times for photolithography.

A display panel and a method for preparing same, and a display device provided in the embodiments of the present disclosure are described above in detail. Although the principles and implementations of the present disclosure are described by using specific examples in this specification, the descriptions of the foregoing embodiments are merely used for helping understand the method and the core idea of the method of the present disclosure. Meanwhile, a person of ordinary skill in the art can make modifications to the specific implementations and application range according to the ideas of the present disclosure. In conclusion, the content of the specification is not to be construed as a limitation to the present disclosure.

What is claimed is:

1. A method for preparing a display panel, comprising:

preparing a pixel define film on a base plate, and forming a step-shaped opening on the pixel define film using a patterning process, wherein the opening comprises a first opening and a second opening, the second opening is located on a side of the first opening that is away from the base plate, and a step surface is formed at a joint between the second opening and the first opening;

forming an organic photoresist in the opening by: forming a layer of organic photoresist on the pixel define film; and removing the organic photoresist outside the opening and a part of the organic photoresist in the second opening and retaining the organic photoresist in the first opening and a part of the organic photoresist in the second opening by means of patterning, so that a top surface of the organic photoresist in the second opening is lower than a top surface of the pixel define film, a part of a sidewall of the second opening is not covered by the organic photoresist, and the organic photoresist covers the step surface;

performing fluorinated plasma treatment on the pixel define film from the top surface of the pixel define film and from the part of the sidewall of the second opening using a fluorinated plasma gas, so that the pixel define film subjected to the fluorinated plasma treatment comprises a first pixel define layer which is hydrophilic and a second pixel define layer which is hydrophobic, wherein the second pixel define layer is disposed on a side of the first pixel define layer away from the base plate and extends from outside the second opening to inside the second opening; and removing the organic photoresist in the opening.

2. The method as claimed in claim 1, wherein the preparing of the pixel define film on the base plate and the forming of the step-shaped opening on the pixel define film using the patterning process comprise:

coating a layer of pixel define layer material on the base plate, and curing the pixel define layer material to form the pixel define film; and performing the patterning process on the pixel define film using an exposure and development process to form the opening.

3. The method as claimed in claim 2, wherein the performing of the patterning process on the pixel define film using the exposure and development process to form the opening comprises:

removing an entirety of the pixel define layer material in an area corresponding to the first opening and a part of the pixel define layer material in an area outside the first opening and within the second opening using a halftone mask and an exposure and development technology.

4. The method as claimed in claim 1, wherein the removing of the organic photoresist outside the opening and the part of the organic photoresist in the second opening by means of patterning comprises:

removing the organic photoresist using oxygen by means of patterning.

\* \* \* \* \*